(12) United States Patent
Baek et al.

(10) Patent No.: US 7,994,557 B2
(45) Date of Patent: Aug. 9, 2011

(54) NON-VOLATILE MEMORY CELLS EMPLOYING A TRANSITION METAL OXIDE LAYER AS A DATA STORAGE MATERIAL LAYER AND METHODS OF MANUFACTURING THE SAME

(75) Inventors: In-Gyu Baek, Seoul (KR); Moon-Sook Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/781,907

(22) Filed: May 18, 2010

(65) Prior Publication Data

US 2010/0224850 A1    Sep. 9, 2010

Related U.S. Application Data

(63) Continuation of application No. 12/200,190, filed on Aug. 28, 2008, now Pat. No. 7,741,669, which is a continuation of application No. 11/179,319, filed on Jul. 12, 2005, now Pat. No. 7,420,198.

(30) Foreign Application Priority Data

Sep. 10, 2004   (KR) .................................. 2004-72754

(51) Int. Cl.
 *H01L 27/108*    (2006.01)
 *H01L 29/76*    (2006.01)
(52) U.S. Cl. ............. 257/296; 257/295; 257/303; 438/3
(58) Field of Classification Search .......... 257/295–296, 257/303, 300, 306, E45.002; 438/3
See application file for complete search history.

(56) References Cited

U.S. PATENT DOCUMENTS

| 4,472,296 | A | 9/1984 | Hunter, Jr. et al. |
| 6,204,139 | B1 | 3/2001 | Liu et al. |
| 6,429,497 | B1 | 8/2002 | Nickel |
| 6,583,003 | B1 | 6/2003 | Hsu et al. |
| 6,649,955 | B2 * | 11/2003 | Lee ............................. 257/295 |
| 2003/0003674 | A1 | 1/2003 | Hsu et al. |
| 2003/0011789 | A1 | 1/2003 | Shirley |
| 2003/0143800 | A1 * | 7/2003 | Hall et al. ..................... 438/240 |
| 2003/0148545 | A1 | 8/2003 | Zhuang et al. |
| 2004/0245557 | A1 | 12/2004 | Seo et al. |
| 2005/0179117 | A1 | 8/2005 | Lee ............................. 257/650 |

FOREIGN PATENT DOCUMENTS

| JP | 07-193882 | 7/1995 |
| JP | 1999-0035958 | 7/1995 |
| JP | 08-133841 | 5/1996 |
| JP | 1999-00036013 | 5/1999 |
| JP | 2003-283000 | 10/2003 |
| KR | 1999-0035958 | 5/1999 |
| KR | 1999-0036013 | 5/1999 |

* cited by examiner

*Primary Examiner* — Theresa T Doan
(74) *Attorney, Agent, or Firm* — Myers Bigel Sibley & Sajovec

(57) ABSTRACT

Non-volatile memory cells employing a transition metal oxide layer as a data storage material layer are provided. The non-volatile memory cells include a lower and upper electrodes overlapped with each other. A transition metal oxide layer pattern is provided between the lower and upper electrodes. The transition metal oxide layer pattern is represented by a chemical formula $M_xO_y$. In the chemical formula, the characters "M", "O", "x" and "y" indicate transition metal, oxygen, a transitional metal composition and an oxygen composition, respectively. The transition metal oxide layer pattern has excessive transition metal content in comparison to a stabilized transition metal oxide layer pattern. Methods of fabricating the non-volatile memory cells are also provided.

16 Claims, 9 Drawing Sheets

NON-VOLATILE MEMORY CELLS EMPLOYING A TRANSITION METAL OXIDE LAYER AS A DATA STORAGE MATERIAL LAYER AND METHODS OF MANUFACTURING THE SAME

RELATED APPLICATIONS

This application is a continuation of and claims priority to U.S. patent application Ser. No. 12/200,190 filed Aug. 28, 2008, now U.S. Pat. No. 7,741,669, which is a continuation of U.S. patent application Ser. No. 11/179,319, filed Jul. 12, 2005 now U.S. Pat. No. 7,420,198 and claims priority under 35 USC §119 to Korean Patent Application No. 2004-72754, filed Sep. 10, 2004, the disclosures of which are hereby incorporated herein by reference in their entirety as set forth fully herein.

FIELD OF THE INVENTION

The present invention relates to semiconductor devices and methods of manufacturing the same and, more particularly, to non-volatile memory devices and methods of manufacturing non-volatile memory devices.

BACKGROUND OF THE INVENTION

Non-volatile memory devices retain their stored data even when their power supplies are turned off. Therefore, non-volatile memory devices have been widely used in computers, mobile telecommunication systems, memory cards and so on. Flash memory devices are widely used as non-volatile memory devices. Many flash memory devices employ memory cells having a stacked gate structure. The stacked gate structure includes a tunnel oxide layer, a floating gate, an inter-gate dielectric layer and a control gate electrode, which are sequentially stacked on a channel region. Film quality of the tunnel oxide layer should be improved in order to improve reliability and program efficiency of the flash memory cells, and a coupling ratio of the flash memory cell should be increased.

Recently, novel non-volatile memory devices, for example, resistance random access memory (RAM) devices have been proposed instead of flash memory devices. A unit cell of a resistance RAM device includes a data storage element having two electrodes and a variable resistive material layer interposed between the two electrodes. The variable resistive material layer, that is, a data storage material layer, may be changed into a conductor or an insulator according to a polarity and/or a magnitude of an electrical signal (voltage or current) applied to the electrodes. In other words, the data storage material layer has a switchable state. The voltage required to convert the data storage material layer to the insulator is referred to as a reset voltage, and the voltage required to convert the data storage material layer to the conductor is referred to as a set voltage.

Resistance RAM devices are disclosed in U.S. Patent Publication Nos. US 2003/00011789 A1, US 2003/0148545 A1 and US 2003/0003674 A1 as well as U.S. Pat. No. 6,583,003 B1. According to these conventional devices, a praseodymium calcium manganese oxide $(Pr,Ca)MnO_3$) layer (hereinafter, referred to as a "PCMO" layer) is used as the data storage material layer. However, it is difficult to pattern the PCMO layer using a conventional photolithography/etch process, which is widely used in the fabrication of semiconductor devices. This patterning complexity may lead to difficulties in improvement of integration density of resistance RAM devices employing a PCMO layer. In addition, four kinds of materials should be mixed to form the PCMO layer. Thus, it may be difficult to form the PCMO layer having a uniform composition throughout the semiconductor substrate. Moreover, a ZnO-based data storage material layer is disclosed in U.S. Pat. No. 4,472,296 to Hunter, Jr. et al. According to Hunter, Jr. et al., the ZnO-based data storage material layer has a switching characteristic at a high voltage of about 50 V.

SUMMARY OF THE INVENTION

According to aspects of the present invention, there are provided non-volatile memory cells having a transition metal oxide layer. The non-volatile memory cells comprise an insulating layer formed on a semiconductor substrate and lower and upper electrodes formed on the insulating layer. The lower and upper electrodes overlap with each other. A transition metal oxide layer pattern is interposed between the lower and upper electrodes. The transition metal oxide layer pattern is expressed by a chemical formula $M_xO_y$. In the chemical formula, the characters "M", "O", "x", and "y" indicate transition metal, oxygen, a transitional metal composition and an oxygen composition, respectively. The transition metal oxide layer pattern contains excessive transition metal in comparison to a stabilized transition metal oxide layer pattern. In some embodiments, when the transition metal "M" is one of nickel (Ni), cobalt (Co), zinc (Zn) and copper (Cu) and the transition metal composition "x" is 1, the oxygen composition "y" may be within a range of 0.5 to 0.99. In other embodiments, when the transition metal "M" is one of hafnium (Hf), zirconium (Zr), titanium (Ti) and chromium (Cr) and the transition metal composition "x" is 1, the oxygen composition "y" may be within a range of 1.0 to 1.98. In yet other embodiments, when the transition metal "M" is iron (Fe) and the transition metal composition "x" is 2, the oxygen composition "y" may be within a range of 1.5 to 2.97. In still other embodiments, when the transition metal "M" is niobium (Nb) and the transition metal composition "x" is 2, the oxygen composition "y" may be within a range of 2.5 to 4.95.

In yet still other embodiments, the lower electrode may be an iridium (Ir) layer, a platinum (Pt) layer, an iridium oxide (IrO) layer, a titanium nitride (TiN) layer, a titanium aluminum nitride (TiAlN) layer, a ruthenium (Ru) layer, a ruthenium oxide (RuO) layer or a polysilicon layer. In further embodiments, the upper electrode may be an iridium (Ir) layer, a platinum (Pt) layer, an iridium oxide (IrO) layer, a titanium nitride (TiN) layer, a titanium aluminum nitride (TiAlN) layer, a ruthenium (Ru) layer, a ruthenium oxide (RuO) layer or a polysilicon layer.

The lower electrode may be electrically connected to the semiconductor substrate through a contact plug that penetrates the insulating layer. A buffer layer may be interposed between the lower electrode and the insulating layer. The buffer layer extends to cover the contact plug. The buffer layer may be a single buffer layer. Alternatively, the buffer layer may comprise a lower buffer layer and an upper buffer layer which are sequentially stacked.

An inter-metal dielectric layer may also be provided on the substrate having the lower electrode, the transition metal oxide layer pattern and the upper electrode, and a bit line may be provided on the inter-metal dielectric layer. The bit line is electrically connected to the upper electrode. The lower electrode, the transition metal oxide layer pattern and the upper electrode may be covered with a capping layer, and an inter-metal dielectric layer may be provided on the substrate having the capping layer. The upper electrode is electrically connected to a bit line disposed on the inter-metal dielectric layer. The capping layer may be an aluminum oxide (AlO) layer.

In additional embodiments, an access transistor may be provided at the semiconductor substrate. The access transistor may include source/drain regions formed in the semiconductor substrate and a gate electrode disposed to cross over a channel region between the source/drain regions. The drain region is electrically connected to the lower electrode.

According to other embodiments of the present invention, methods of manufacturing a non-volatile memory cell having a transition metal oxide layer are provided. The methods include forming an insulating layer on a semiconductor substrate and forming a lower electrode layer on the insulating layer. A transition metal oxide layer is formed on the lower electrode layer. The transition metal oxide layer is represented by a chemical formula $M_xO_y$. In the chemical formula, the characters "M", "O", "x" and "y" indicate transition metal, oxygen, a transitional metal composition and an oxygen composition, respectively. The transition metal oxide layer is formed to contain excessive transition metal in comparison to a stable transition metal oxide layer. An upper electrode layer is formed on the transition metal oxide layer. The upper electrode layer, the transition metal oxide layer and the lower electrode layer are patterned to form a lower electrode, a transition metal oxide layer pattern and an upper electrode which are sequentially stacked.

In some of these embodiments, the transition metal oxide layer may be formed by alternately and repeatedly performing a process for forming a transition metal layer and a process for oxidizing the transition metal layer using an oxygen plasma treatment technique. Alternatively, the transition metal oxide layer may be formed using a sputtering technique. In addition, the oxygen plasma treatment may be performed using an in-situ process. In other embodiments, the transition metal oxide layer may be formed using an $O_2$ reactive sputtering technique, a chemical vapor deposition technique or an atomic layer deposition technique.

In still further embodiments of the invention, an access transistor may be formed at the semiconductor substrate prior to formation of the insulating layer, and a contact plug may be formed in the insulating layer. The access transistor may be formed to have source/drain regions formed in the semiconductor substrate and a gate electrode disposed to cross over a channel region between the source/drain regions, and the contact plug may be formed to electrically connect the lower electrode to the drain region. In addition, a buffer layer may be formed to cover the insulating layer and the contact plug prior to formation of the lower electrode layer. The buffer layer may be additionally patterned after formation of the lower electrode. The buffer layer may be formed of a single buffer layer. Alternatively, the buffer layer may be formed by sequentially stacking a lower buffer layer and an upper buffer layer.

In still further embodiments, an inter-metal dielectric layer may be formed on the substrate having the lower electrode, the transition metal oxide layer pattern and the upper electrode, and a bit line may be formed on the inter-metal dielectric layer. The bit line is electrically connected to the upper electrode. Prior to formation of the inter-metal dielectric layer, a capping layer may be formed to cover the lower electrode, the transition metal oxide layer pattern and the upper electrode. The capping layer may be formed of an aluminum oxide (AlO) layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
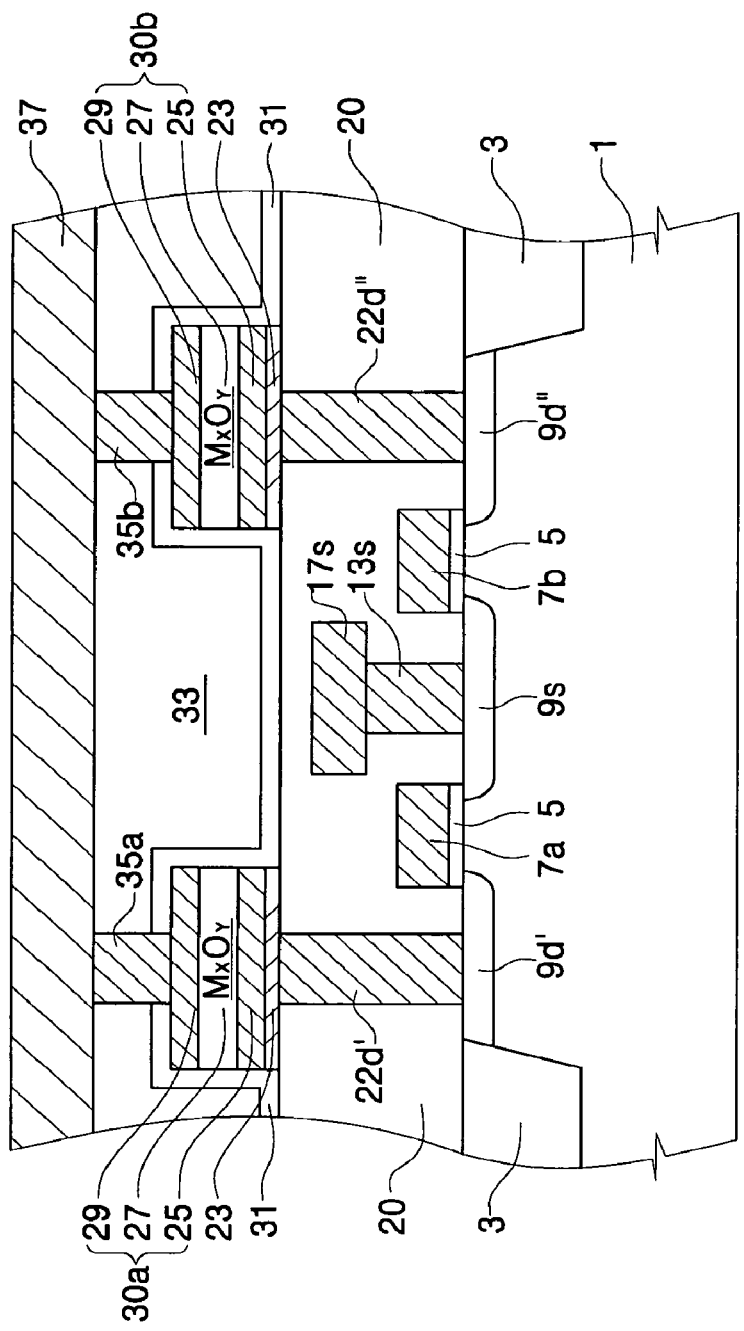
FIG. 1 is a cross-sectional view illustrating resistance RAM cells according to embodiments of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and, will fully convey the concept of the invention to those skilled in the art. In the drawings, the thicknesses of layers and regions are exaggerated for clarity. Like reference numerals in the drawings denote like elements.

FIG. 1 is a cross-sectional view illustrating a pair of non-volatile memory cells, e.g., a pair of resistance RAM cells according to embodiments of present invention. Referring to FIG. 1, an isolation layer 3 is provided at a predetermined region of a semiconductor substrate 1 to define an active region. First and second drain regions 9d' and 9d''', which are spaced apart from each other, are provided in the active region. A common source region 9s is provided in the active region between the first and second drain regions 9d' and 9d'''. A first gate electrode 7a is disposed to cross over the active region between the common source region 9s and the first drain region 9d', and a second gate electrode 7b is disposed to cross over the active region between the common source region 9s and the second drain region 9d'''. The first and second gate electrodes 7a and 7b extend to act as first and second word lines, respectively. The first and second gate electrodes 7a and 7b are insulated from the active region by a gate insulating layer 5. The first word line 7a, the common source region 9s and the first drain region 9d' constitute a first access transistor, and the second word line 7b, the common source region 9s and the second drain region 9d''' constitute a second access transistor.

The access transistors and the isolation layer 3 are covered with an insulating layer 20. The insulating layer 20 may be a silicon oxide layer, a silicon nitride layer or a combination layer thereof. The common source region 9s is electrically connected to a common source line 17s in the insulating layer 20 through a source contact plug 13s. The common source line 17s may be disposed to be parallel with the word lines 7a and 7b. The first drain region 9d' is electrically connected to a first node contact plug 22d' that penetrates the insulating layer 20, and the second drain region 9d" is electrically connected to a second node contact plug 22d" that penetrates the insulating layer 20.

First and second data storage elements 30a and 30b are provided on the insulating layer 20. The first data storage element 30a is disposed to cover the first node contact plug 22d', and the second data storage element 30b is disposed to cover the second node contact plug 22d". Each of the first and second data storage elements 30a and 30b may include a lower electrode 25, a transition metal oxide layer pattern 27 and an upper electrode 29, which are sequentially stacked.

The lower electrode 25 is preferably an oxidation resistant metal layer. For example, the lower electrode 25 may be an iridium (Ir) layer, a platinum (Pt) layer, an iridium oxide (IrO) layer, a titanium nitride (TiN) layer, a titanium aluminum nitride (TiAlN) layer, a ruthenium (Ru) layer or a ruthenium oxide (RuO) layer. Alternatively, the lower electrode 25 may be a polysilicon layer.

The transition metal oxide layer pattern 27 can be represented by a chemical formula $M_xO_y$. In the chemical formula, the characters "M", "O", "x" and "y" indicate transition metal, oxygen, a transition metal composition and an oxygen composition, respectively. In these embodiments, the oxygen composition "y" of the transition metal oxide layer pattern 27 is preferably less than it would be in a stable state of the transition metal oxide layer pattern 27. In other words, it is preferable that the transition metal oxide layer pattern 27 has excessive transition metal content in comparison to a stable transition metal oxide layer pattern. This is because a switching characteristic (for example, a switching voltage such as a reset voltage and a set voltage) of the transition metal oxide layer pattern 27 may be improved when the transition metal content in the transition metal oxide layer pattern 27 is excessive.

In an embodiment of the present invention, if the transition metal "M" is nickel (Ni), cobalt (Co), zinc (Zn) or copper (Cu), the transition metal oxide layer pattern 27 has a stable state when both of the transition metal composition "x" and the oxygen composition "y" are 1. In this case, in order to improve the switching characteristic of the transition metal oxide layer pattern 27, e.g., a nickel oxide ($Ni_xO_y$) layer, a cobalt oxide ($Co_xO_y$) layer, a zinc oxide ($Zn_xO_y$) layer or a copper oxide ($Cu_xO_y$) layer, the oxygen composition "y" is preferably less than 1 when the composition "x" of the nickel (Ni), the cobalt (Co), the zinc (Zn) or the copper (Cu) is 1. More preferably, the oxygen composition "y" is within a range of 0.5 to 0.99 when the composition "x" of the nickel (Ni), the cobalt (Co), the zinc (Zn) or the copper (Cu) is 1.

In another embodiment, if the transition metal "M" is hafnium (Hf), zirconium (Zr), titanium (Ti) or chromium (Cr), the transition metal oxide layer pattern 27 has a stable state when the transition metal composition "x" and the oxygen composition "y" are 1 and 2, respectively. In this case, in order to improve the switching characteristic of the transition metal oxide layer pattern 27, e.g., a hafnium oxide ($Hf_xO_y$) layer, a zirconium oxide ($Zr_xO_y$) layer, a titanium oxide ($Ti_xO_y$) layer or a chromium oxide ($Cr_xO_y$) layer, the oxygen composition "y" is preferably less than 2 when the composition "x" of the hafnium (Hf), the zirconium (Zr), the titanium (Ti) or the chromium (Cr) is 1. More preferably, the oxygen composition "y" is within a range of 1 to 1.98 when the composition "x" of the hafnium (Hf), the zirconium (Zr), the titanium (Ti) or the chromium (Cr) is 1.

In still another embodiment, if the transition metal "M" is iron (Fe), the transition metal oxide layer pattern 27 has a stable state when the transition metal composition "x" and the oxygen composition "y" are 2 and 3 respectively. In this case, in order to improve the switching characteristic of the transition metal oxide layer pattern 27, e.g., an iron oxide ($Fe_xO_y$) layer, the oxygen composition "y" is preferably less than 3 when the composition "x" of the iron (Fe) is 2. More preferably, the oxygen composition "y" is within a range of 1.5 to 2.97 when the composition "x" of the iron (Fe) is 2.

In yet still another embodiment, if the transition metal "M" is niobium (Nb), the transition metal oxide layer pattern 27 has a stable state when the transition metal composition "x" and the oxygen composition "y" are 2 and 5 respectively. In this case, in order to improve the switching characteristic of the transition metal oxide layer pattern 27, e.g., a niobium oxide ($Nb_xO_y$) layer, the oxygen composition "y" is preferably less than 5 when the composition "x" of the niobium (Nb) is 2. More preferably, the oxygen composition "y" is within a range of 2.5 to 4.95 when the composition "x" of the niobium (Nb) is 2. Moreover, the transition metal oxide layer pattern 27 may be a combination of the transition metal oxide layer patterns having the aforementioned excessive transition metal content (i.e., a composite of multiple transition metal oxide layers). In addition, the transition metal oxide layer pattern 27 may contain impurity ions such as lithium (Li) ions, calcium (Ca) ions, chromium (Cr) ions or Lanthanum (La) ions.

The upper electrode 29 may also be an oxidation resistant metal layer. For example, the upper electrode 29 may be an iridium (Ir) layer, a platinum (Pt) layer, an iridium oxide (IrO) layer, a titanium nitride (TiN) layer, a titanium aluminum nitride (TiAlN) layer, a ruthenium (Ru) layer or a ruthenium oxide (RuO) layer. Alternatively, the upper electrode 29 may be a polysilicon layer.

Buffer layer patterns 23 may be interposed between the data storage elements 30a and 30b and the insulating layer 20. The buffer layer patterns 23 may extend to cover the node contact plugs 22d' and 22d". The buffer layer patterns 23 serve as a wetting layer that improves adhesion between the lower electrodes 25 and the insulating layer 20. Each of the buffer layer patterns 23 may be a single buffer layer. The single buffer layer may be a titanium (Ti) layer, a titanium nitride (TiN) layer, a titanium aluminum nitride (TiAlN) layer, a tantalum (Ta) layer or a tantalum nitride (TaN) layer. Alternatively, each of the buffer layer patterns 23 may comprise a lower buffer layer pattern and an upper buffer layer pattern, which are sequentially stacked. In this case, the lower buffer layer pattern may be one of a titanium (Ti) layer, a titanium nitride (TiN) layer, a titanium aluminum nitride (TiAlN) layer, a tantalum (Ta) layer and a tantalum nitride (TaN) layer, and the upper buffer layer pattern may also be one of a titanium (Ti) layer, a titanium nitride (TiN) layer, a titanium aluminum nitride (TiAlN) layer, a tantalum (Ta) layer and a tantalum nitride (TaN) layer.

The data storage elements 30a and 30b and the insulating layer 20 may be covered with an inter-metal dielectric layer 33. The inter-metal dielectric layer 33 may be a silicon oxide layer. In this case, adhesion between the inter-metal dielectric layer 33 and the electrodes 25 and 29 may be weak. In addition, the silicon oxide layer used as the inter-metal dielectric layer 33 may exhibit a parasitic switching characteristic, even though weaker than that of the transition metal oxide layer pattern 27. Moreover, in the event that sidewalls of the transition metal oxide layer patterns 27 are in direct contact with the inter-metal dielectric layer 33, impurities such as silicon atoms in the inter-metal dielectric layer 33 may be diffused into the transition metal oxide layer patterns 27 to degrade the switching characteristic of the transition metal oxide layer patterns 27. Therefore, in order to improve adhesion between the inter-metal dielectric layer 33 and the electrodes 25 and 29 and prevent the switching characteristic of the transition metal oxide layer patterns 27 from being degraded, a capping layer 31 may be provided between the data storage elements 30a and 30b and the inter-metal dielectric layer 33. The capping layer 31 may extend to cover the insulating layer 20. In the event that the buffer layer patterns 23 are provided, the capping layer 31 may cover the sidewalls of the buffer layer patterns 23. The capping layer 31 may be an aluminum oxide (AlO) layer.

A bit line 37 may be disposed on the inter-metal dielectric layer 33. The bit line 37 may be electrically connected to the upper electrodes 29 through bit line contact plugs 35a and 35b that penetrate the inter-metal dielectric layer 33 and the capping layer 31. The bit line 37 may be disposed to cross over the word lines 7a and 7b. The first data storage element 30a and the first access transistor constitutes a first resistance RAM cell, and the second data storage element 30b and the second access transistor constitutes a second resistance RAM cell.

Now, methods of driving the resistance RAM cells according to the above embodiments will be described in brief. First, in order to selectively store a desired data in any one (for example, the first resistance RAM cell) of the resistance RAM cells, the common source line 17s is grounded and the first access transistor is selectively turned on. In order to selectively turn on the first access transistor, a word line voltage, which is higher than a threshold voltage of the first access transistor, is applied to the first word line 7a. In this case, the second word line 7b is grounded to turn off the second access transistor. Next, a reset voltage or a set voltage is applied to the bit line 37 while the first access transistor is turned on. In general, the set voltage is higher than the reset voltage.

When the set voltage is applied to the bit line 37, a conductive filament is formed in the transition metal oxide layer pattern 27 of the first data storage element 30a to reduce the electrical resistance of the first data storage element 30a. On the contrary, when the reset voltage is applied to the bit line 37, the conductive filament in the first data storage element 30a is removed to increase the electrical resistance of the first data storage element 30a.

The initial transition metal oxide layer pattern 27 may exhibit high electrical resistance that corresponds to a reset state that does not have the conductive filament. In this case, even though the set voltage is applied to the initial transition metal oxide layer pattern 27, the conductive filament may not be formed in the initial transition metal oxide layer pattern 27. This may be due to a poor interface characteristic between the initial transition metal oxide layer pattern 27 and the electrodes 25 and 29 and/or a material property of the initial transition metal oxide layer pattern 27. Therefore, in order to completely convert the initial transition metal oxide layer pattern 27 to a conductor exhibiting a normal set state, it may be necessary to apply a forming voltage higher than the set voltage to the transition metal oxide layer pattern 27. The switching characteristic of the transition metal oxide layer pattern 27 may have direct influence on the material property of the transition metal oxide layer pattern 27. In other words, the set voltage, the reset voltage and the forming voltage may be determined according to the composition ratio and the thickness of the transition metal oxide layer pattern 27.

Next, an operation of reading the data stored in the first resistance RAM cell may be achieved by applying a ground voltage, a word line voltage and a read voltage to the common source line 17s, the first word line 7a and the bit line 37 respectively. The applied read voltage should be lower than the reset voltage in order to prevent the first resistance RAM cell from being programmed during the read operation. In the event that the transition metal oxide layer pattern 27 of the first data storage element 30a has the set state (low resistance), a large set current flows through the bit line 37, the first data storage element 30a and the first access transistor. As a result, the applied read voltage applied to the bit line 37 falls down to a first read voltage which is lower than the applied read voltage. On the other hand, in the event that the transition metal oxide layer pattern 27 of the first data storage element 30a has the reset state (high resistance), a small reset current flows through the bit line 37, the first data storage element 30a and the first access transistor. As a result, the read voltage applied to the bit line 37 rises up to a second read voltage, which is higher than the applied read voltage. Accordingly, a sense amplifier (not shown) connected to the bit line 37 can discriminate whether the data stored in the selected resistance RAM cell is a logic "1" or a logic "0" using a reference voltage between the first and second read voltages.

Figure 2:
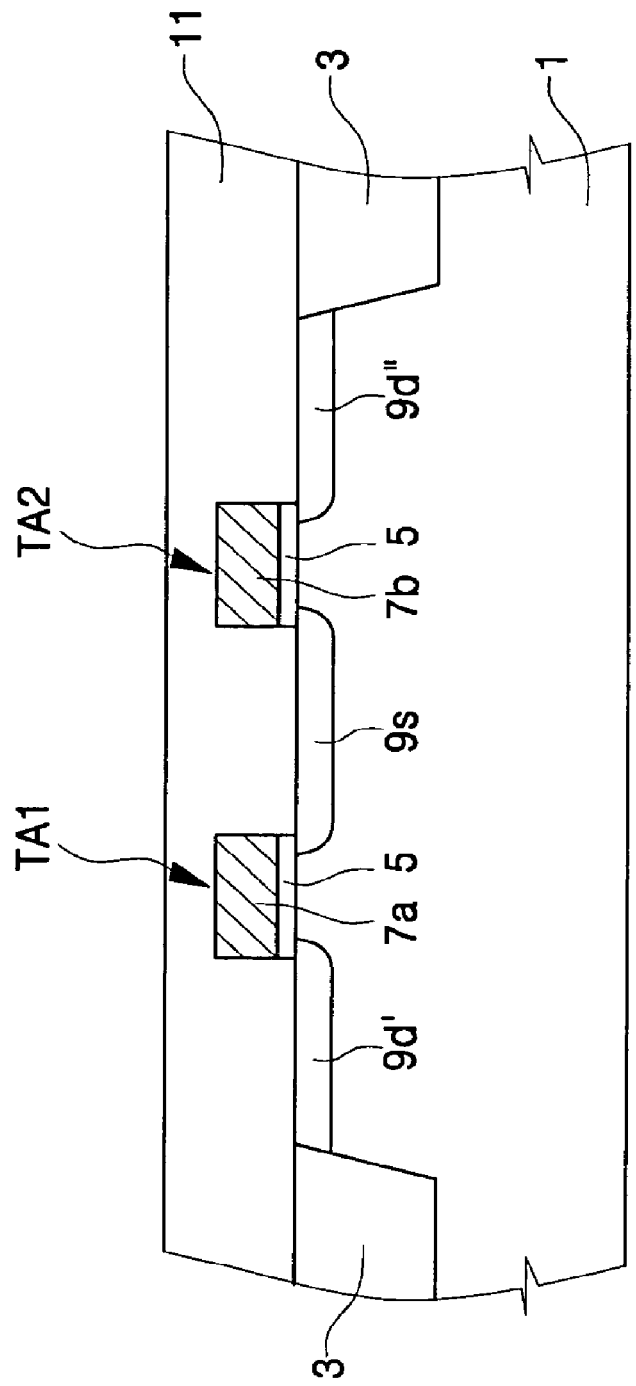
FIGS. 2 to 4 are cross-sectional views that illustrate methods of manufacturing the resistance RAM cells shown in FIG. 1.
Figure 3:
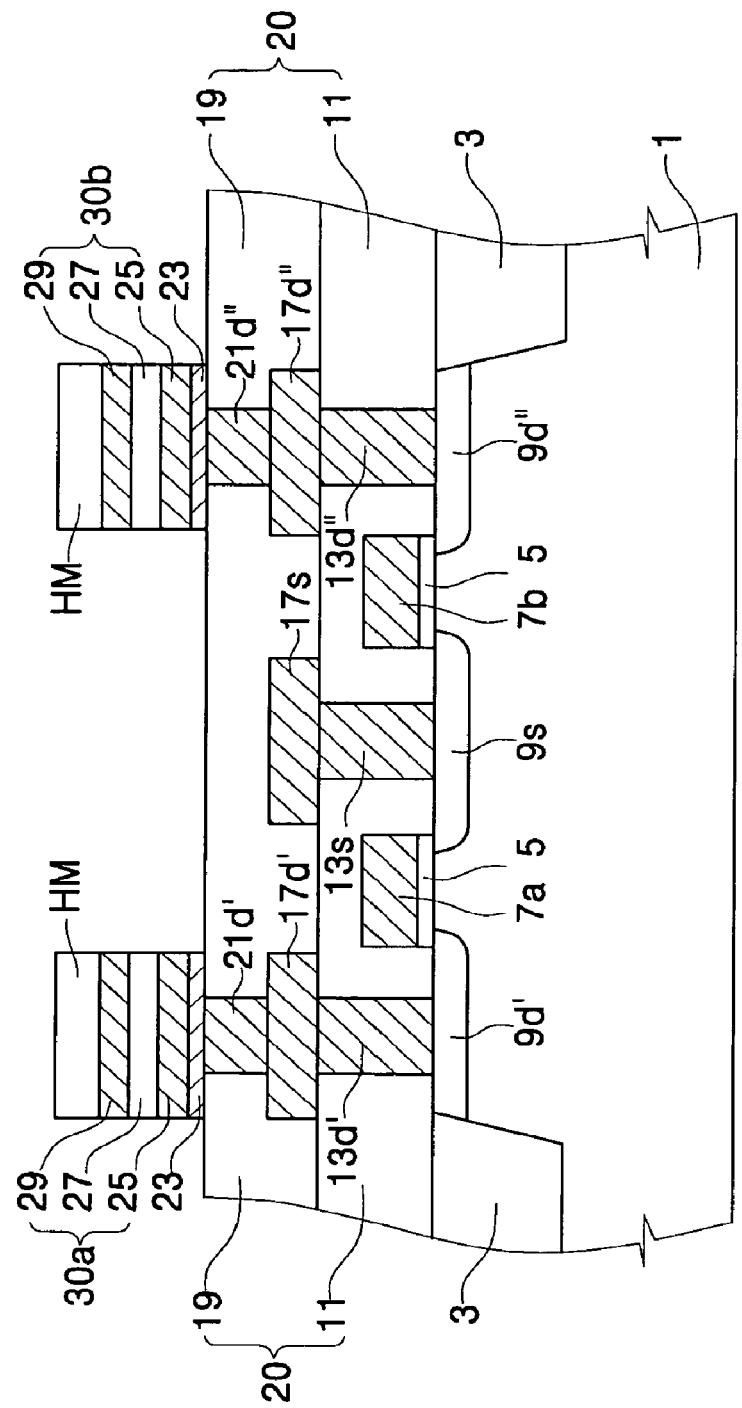
Figure 4:
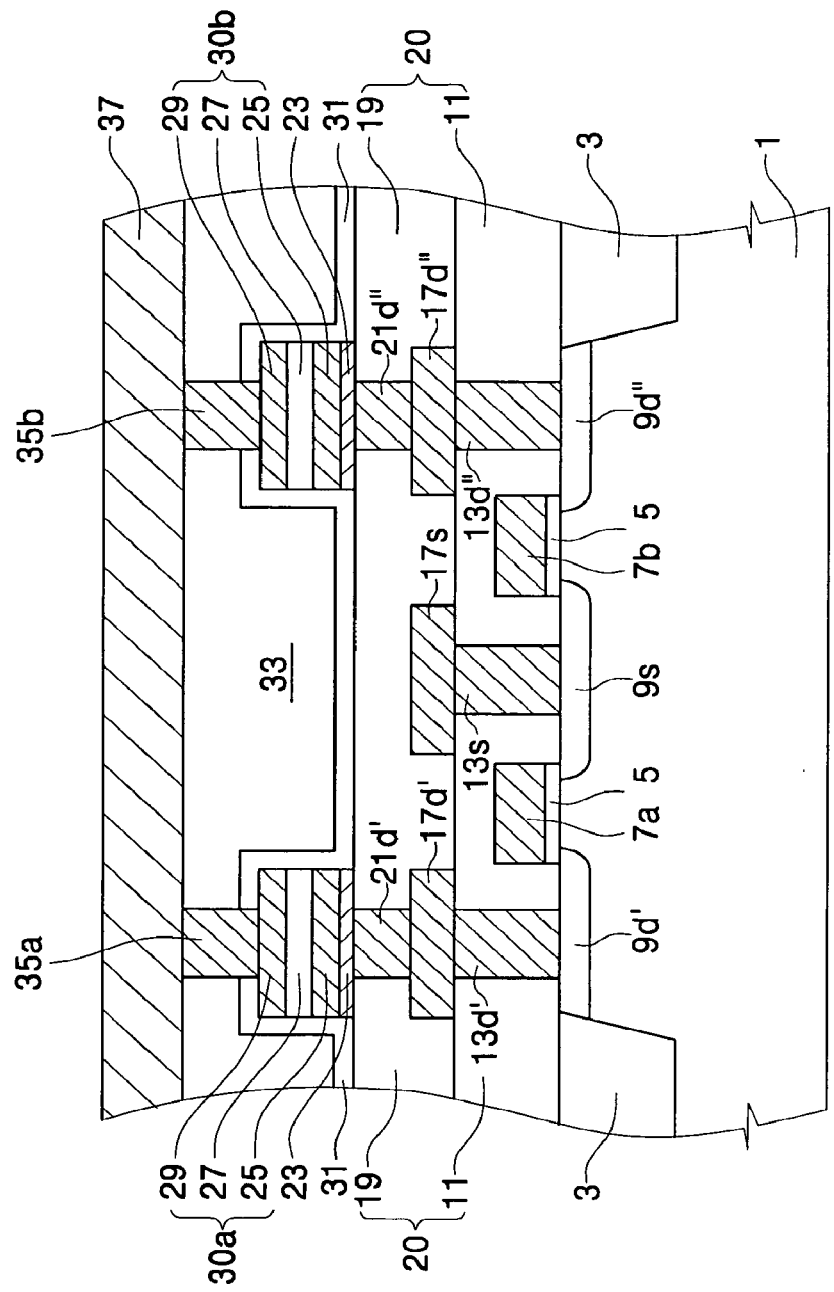

FIGS. 2 to 4 are cross-sectional views to illustrate methods of manufacturing the resistance RAM cells shown in FIG. 1. Referring to FIG. 2, an isolation layer 3 is formed at a predetermined region of a semiconductor substrate 1 to define an active region. A gate insulating layer 5 is formed on the active region, and a gate conductive layer is formed on the substrate having the gate insulating layer 5. The gate conductive layer is patterned to form a pair of gate electrodes, for example, first and second gate electrodes 7a and 7b that crosses over the active region. The first and second gate electrodes 7a and 7b may extend to serve as first and second word lines respectively.

Impurity ions are implanted into the active region using the word lines 7a and 7b as ion implantation masks, thereby forming a common source region 9s as well as first and second drain regions 9d' and 9d". The common source region 9s is formed in the active region between the word lines 7a and 7b. In addition, the first drain region 9d' is formed in the active region which is adjacent to the first word line 7a and located opposite the common source region 9s, and the second drain region 9d" is formed in the active region which is adjacent to the second word line 7b and located opposite the common source region 9s. The first word line 7a, the common source region 9s and the first drain region 9d' constitute a first access transistor TA1, and the second word line 7b, the common source region 9s and the second drain region 9d" constitute a second access transistor TA2. A first interlayer insulating layer 11 is formed on the substrate having the first and second access transistors TA1 and TA2. The first interlayer insulating layer 11 may be formed of a silicon oxide layer.

Referring to FIG. 3, the first interlayer insulating layer 11 is patterned to form first and second drain contact holes exposing the first and second drain regions 9d' and 9d" as well as a common source contact hole exposing the common source region 9s. A conductive layer such as a doped polysilicon layer is formed on the substrate having the drain contact holes and the common source contact hole, and the conductive layer is planarized to expose an upper surface of the first interlayer insulating layer 11. As a result, first and second drain contact plugs 13d' and 13d" are formed in the first and second drain contact holes respectively, and a common source contact plug 13s is formed in the common source contact hole.

A conductive layer such as a metal layer is formed on the substrate having the contact plugs 13d', 13d" and 13s. The conductive layer is then patterned to form a common source line 17s covering the common source contact plug 13s as well as first and second drain pads 17d' and 17d" respectively covering the first and second drain contact plugs 13d' and 13d". The common source line 17s may be formed to be parallel to the word lines 7a and 7b. Then, a second interlayer insulating layer 19 is formed on the substrate having the drain pads 17d' and 17d" as well as the common source line 17s. The second interlayer insulating layer 19 may be formed of an insulating layer such as a silicon oxide layer. The first and second interlayer insulating layers 11 and 19 constitute a composite insulating layer 20.

First and second node contact plugs 21d' and 21d" may be formed in the second interlayer insulating layer 19. The first and second node contact plugs 21d' and 21d" are formed to be in contact with the first and second drain pads 17d' and 17d", respectively. The node contact plugs 21d' and 21d" are formed of a conductive layer. A lower electrode layer is then formed on the substrate having the node contact plugs 21d' and 21d". The lower electrode layer is preferably formed of an oxidation resistant metal layer. This is because the interface characteristic between the lower electrode layer and a material layer contacting the lower electrode may be degraded if the lower electrode layer is oxidized during a subsequent thermal process. In the embodiments of the present invention, the lower electrode layer may be formed of an iridium (Ir) layer, a platinum (Pt) layer, an iridium oxide (IrO) layer, a titanium nitride (TiN) layer, a titanium aluminum nitride (TiAlN) layer, a ruthenium (Ru) layer or a ruthenium oxide (RuO) layer. Alternatively, the lower electrode layer may be formed of a polysilicon layer.

A conductive buffer layer may be additionally formed prior to formation of the lower electrode layer. The conductive buffer layer is formed in order to improve adhesion between the lower electrode layer and the second interlayer insulating layer 19. The buffer layer may be formed of a single buffer layer. In this case, the single buffer layer may be formed of a titanium (Ti) layer, a titanium nitride (TiN) layer, a titanium aluminum nitride (TiAlN) layer, a tantalum (Ta) layer or a tantalum nitride (TaN) layer. Alternatively, the buffer layer may be formed by sequentially stacking a lower buffer layer and an upper buffer layer. In this case, the lower buffer layer may be formed of a titanium (Ti) layer, a titanium nitride (TiN) layer, a titanium aluminum nitride (TiAlN) layer, a tantalum (Ta) layer or a tantalum nitride (TaN) layer. The upper buffer layer may be also formed of a titanium (Ti) layer, a titanium nitride (TiN) layer, a titanium aluminum nitride (TiAlN) layer, a tantalum (Ta) layer or a tantalum nitride (TaN) layer.

A transition metal oxide layer represented by a chemical formula $M_xO_y$ is formed on the lower electrode layer. In the chemical formula, the characters "M", "O", "x" and "y" indicate transition metal, oxygen, a transition metal composition and an oxygen composition, respectively. In these embodiments, the transition metal oxide layer preferably has excessive transition metal content in comparison to normal transition metal content of the transition metal oxide layer at a stable state. In other words, the transition oxide layer is preferably formed to have less oxygen content than the transition metal oxide layer having a stable state. This is because the switching characteristic (for example, switching voltages such as a reset voltage and a set voltage) of the transition metal oxide layer may be improved when the transition metal content is excessive.

In an embodiment of the present invention, the transition metal oxide layer may be formed of a nickel oxide ($Ni_xO_y$) layer, a cobalt oxide ($Co_xO_y$) layer, a zinc oxide ($Zn_xO_y$) layer or a copper oxide ($Cu_xO_y$) layer. In this case, it is preferable that the transition metal oxide layer is formed so that the oxygen composition "y" is within a range of 0.5 to 0.99 when the composition "x" of the nickel (Ni), the cobalt (Co), the zinc (Zn) or the copper (Cu) is 1. In another embodiment, the transition metal oxide layer may be formed of a hafnium oxide ($Hf_xO_y$) layer, a zirconium oxide ($Zr_xO_y$) layer, a titanium oxide ($Ti_xO_y$) layer or a chromium oxide ($Cr_xO_y$) layer. In this case, it is preferable that the transition metal oxide layer is formed so that the oxygen composition "y" is within a range of 1 to 1.98 when the composition "x" of the hafnium (Hf), zirconium (Zr), titanium (Ti) or chromium (Cr), is 1. In still another embodiment, the transition metal oxide layer may be formed of an iron oxide ($Fe_xO_y$) layer. In this case, it is preferable that the transition metal oxide layer is formed so that the oxygen composition "y" is within a range of 1.5 to 2.97 when the composition "x" of the iron (Fe) is 2. In yet still another embodiment, the transition metal oxide layer may be formed of a niobium oxide ($Nb_xO_y$) layer. In this case, it is preferable that the transition metal oxide layer is formed so that the oxygen composition "y" is within a range of 2.5 to 4.95 when the composition "x" of the niobium (Nb) is 2. Moreover, the transition metal oxide layer may be formed as a composite of the transition metal oxide layers having the aforementioned excessive transition metal content.

Figure 5:
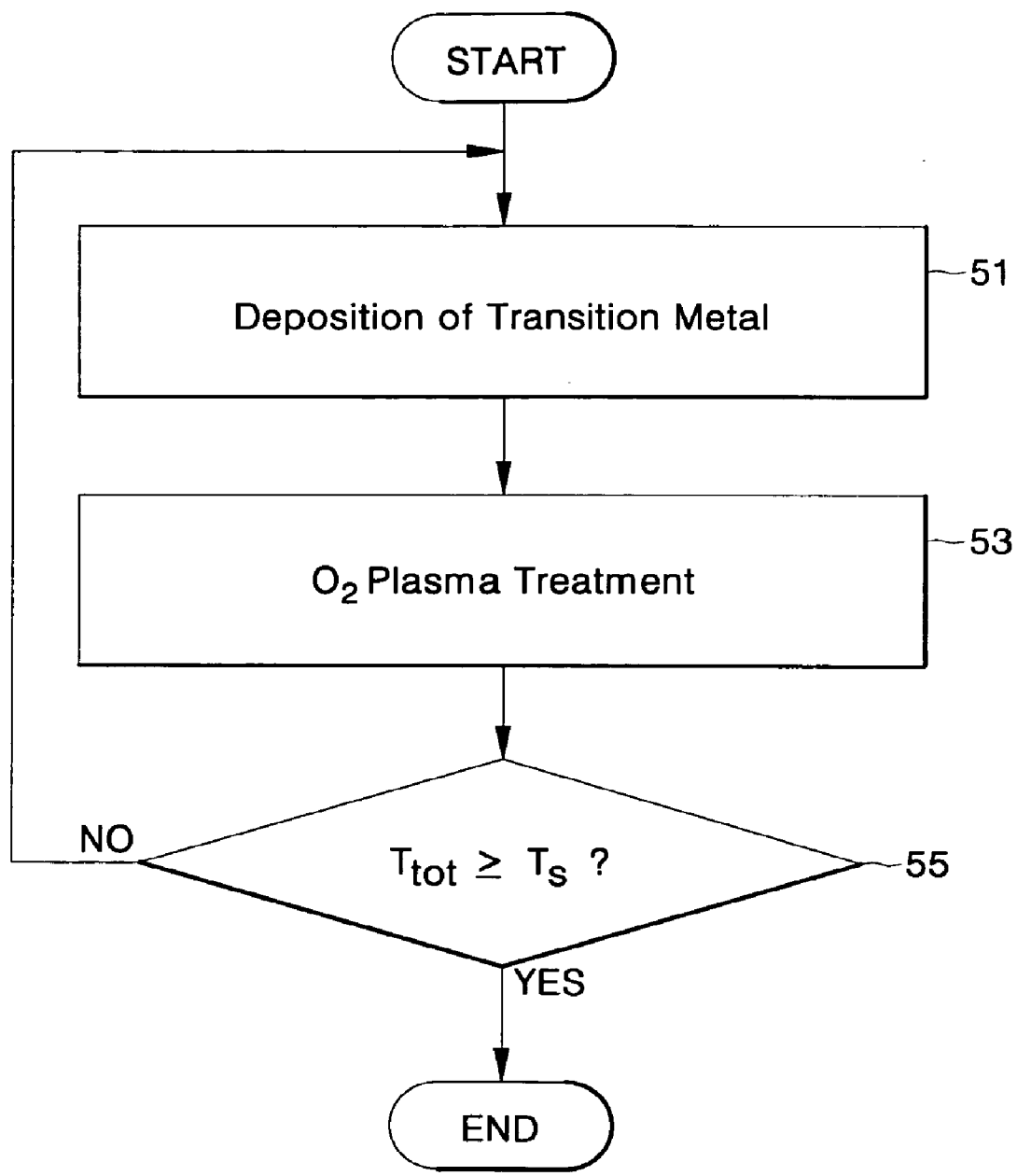
FIG. 5 is a flowchart to illustrate methods of forming a transition metal oxide layer of a resistance RAM cell according to embodiments of the present invention.

FIG. 5 is a process flowchart that illustrates methods of forming transition metal oxide layers according to embodiments of the present invention. Referring to FIG. 5, a substrate having the lower electrode layer is loaded into a process chamber, and a transition metal layer may be formed to a thickness of 5 to 20 Å on the lower electrode layer (step 51). The transition metal layer may be formed of a nickel (Ni) layer, a cobalt (Co) layer, a zinc (Zn) layer, a copper (Cu) layer, a hafnium (Hf) layer, a zirconium (Zr) layer, a titanium (Ti) layer, a chromium (Cr) layer, an iron (Fe) layer or a niobium (Nb) layer using a sputtering technique. The transition metal layer is then oxidized using an oxygen plasma treatment technique (step 53). The oxygen plasma treatment process may be performed using an in-situ process without a vacuum break. The oxygen composition of the oxidized transition metal layer may be changed according to a process condition of the oxygen plasma treatment process. For example, the oxygen composition of the oxidized transition metal layer may be determined depending on an oxygen plasma treatment time, a flow rate of oxygen and/or a power for generating oxygen plasma. Subsequently, the formation process of the transition metal layer (step 51) and the oxygen plasma treatment process (Step 53) are alternately and repeatedly performed until a cumulative thickness $T_{tot}$ of the oxidized transition metal layers is equal to or greater than a desired thickness $T_s$ (step 55). Alternatively, the transition metal oxide layer may be formed using an $O_2$ reactive sputtering technique, a chemical vapor deposition technique or an atomic layer deposition technique.

Referring again to FIG. 3, an upper electrode layer is formed on the transition metal oxide layer. The upper electrode layer is preferably formed of an oxidation resistant metal layer. This is because the interface characteristic of the lower electrode layer and the transition metal oxide layer may be degraded when the upper electrode layer is oxidized during a subsequent thermal process. In these embodiments, the upper electrode layer may be formed of an iridium (Ir) layer, a platinum (Pt) layer, an iridium oxide (IrO) layer, a titanium nitride (TiN) layer, a titanium aluminum nitride (TiAlN) layer, a ruthenium (Ru) layer or a ruthenium oxide (RuO) layer. Alternatively, the upper electrode layer may be formed of a polysilicon layer.

A hard mask layer may be formed on the upper electrode layer. The hard mask layer may be formed of a material layer having an etching selectivity with respect to the upper electrode layer, the transition metal oxide layer, the lower electrode layer and the buffer layer. For example, the hard mask layer may be formed of a silicon nitride (SiN) layer or a titanium nitride (TiN) layer. The hard mask layer is patterned using a photolithography/etch process, thereby forming hard mask patterns HM on the drain pads 17d' and 17d". The upper electrode layer, the transition metal oxide layer, the lower electrode layer and the buffer layer are then etched in sequence using the hard mask patterns HM as etching masks. As a result, first and second data storage elements 30a and 30b are formed on the first and second node contact plugs 21d' and 21d" respectively, and buffer layer patterns 23 are formed between the data storage elements 30a and 30b and the second interlayer insulating layer 19. As shown in FIG. 3, each of the data storage elements 30a and 30b is formed to include a lower electrode 25, a transition metal oxide layer pattern 27 and an upper electrode 29 which are sequentially stacked. The hard mask patterns HM may be removed after formation of the data storage elements 30a and 30b.

Referring now to FIG. 4, an inter-metal dielectric layer 33 is formed on the substrate having the data storage elements 30a and 30b. The inter-metal dielectric layer 33 may be formed of a silicon oxide layer. A capping layer 31 may be formed to cover the data storage elements 30a and 30b prior to formation of the inter-metal dielectric layer 33. The capping layer 31 is formed in order to prevent impurities (for example, silicon atoms) of the inter-metal dielectric layer 33 from being diffused into the transition metal oxide layer pattern 27 and improve adhesion between the inter-metal dielectric layer 33 and the electrodes 25 and 29. In these embodiments, the capping layer 31 may be formed of an aluminum oxide (AlO) layer.

The inter-metal dielectric layer 33 and the capping layer 31 are patterned to form bit line contact holes that expose the upper electrodes 29, and bit line contact plugs 35a and 35b are formed in the bit line contact holes. A conductive layer such as a metal layer is formed on the substrate having the bit line contact plugs 35a and 35b, and the conductive layer is patterned to form a bit line 37 covering the bit line contact plugs 35a and 35b. The bit line 37 may be formed to cross over the word lines 7a and 7b.

Figure 6:
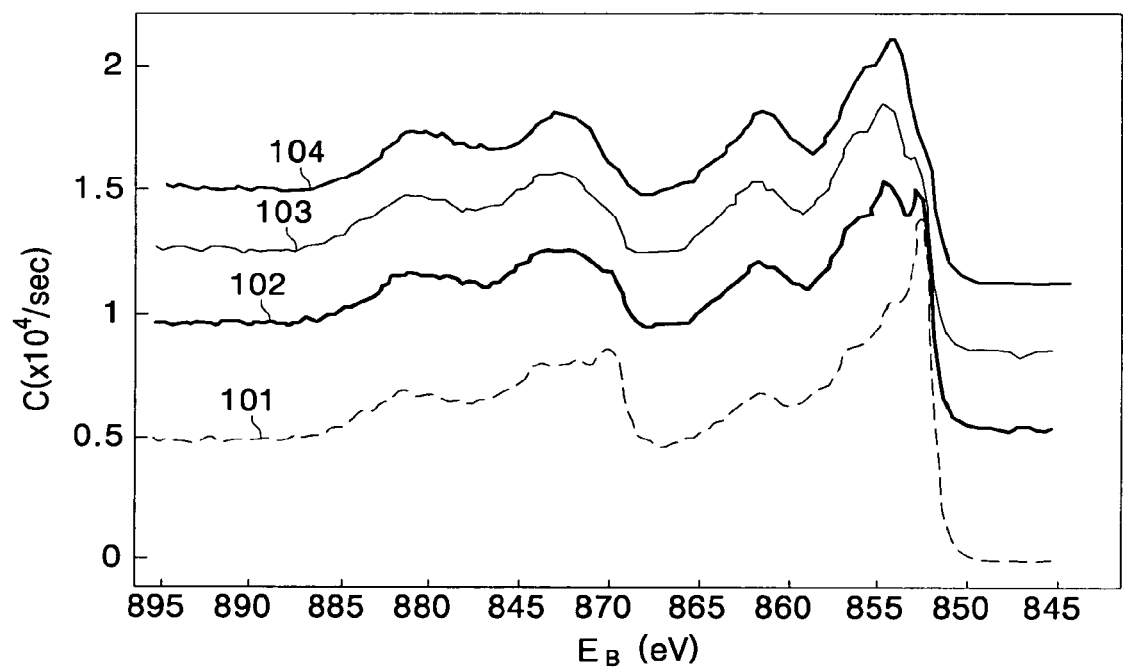
FIG. 6 is a graph illustrating x-ray photoelectron spectroscopy (XPS) data of nickel oxide layers formed according to embodiments of the present invention.

FIG. 6 is a graph illustrating x-ray photo electron spectroscopy (XPS) measurement data in order to obtain composition ratios of nickel oxide ($Ni_xO_y$) layers manufactured according to embodiments of the present invention. In FIG. 6, the abscissa indicates binding energy $E_B$ of elements in the nickel oxide (NiO) layers, and the ordinate indicates the number of photo electrons emitted from the nickel oxide (NiO) layers during a unit time (1 second) when x-rays are irradiated onto the nickel oxide (NiO) layers. The nickel oxide (NiO) layers were formed by alternately and repeatedly performing a first process for forming a nickel (Ni) layer using a sputtering technique and a second process for oxidizing the nickel (Ni) layer using an oxygen plasma treatment technique during a predetermined time Tp. Each of the nickel (Ni) layers was formed to a thickness of 10 Å. The oxygen plasma treatment process was performed using an RF power of 20 watts and an oxygen gas introduced with a flow rate of 2 sccm (standard cubic centimeter per minute). In addition, the nickel oxide (NiO) layers were formed to have a final thickness of 400 Å. Prior to measurement of the XPS data, an argon ion sputter etching process was carried out in order to remove impurities existing on the surfaces of the nickel oxide (NiO) layers. The argon ion sputter etching process was performed using a voltage of 2 kV for two minutes.

In the graph of FIG. 6, a curve 101 corresponds to measurement results of the nickel oxide (NiO) layer formed with the oxygen plasma treatment time Tp of 5 seconds, and a curve 102 corresponds to measurement results of the nickel oxide (NiO) layer formed with the oxygen plasma treatment time Tp of 20 seconds. In addition, a curve 103 corresponds to measurement results of the nickel oxide (NiO) layer formed with the oxygen plasma treatment time Tp of 40 seconds, and a curve 104 corresponds to measurement results of the nickel oxide (NiO) layer formed with the oxygen plasma treatment time Tp of 120 seconds.

The oxygen compositions "y" of the nickel oxide ($Ni_xO_y$) layers, which are calculated from the measurement results of FIG. 6, are listed in the following Table 1.

TABLE 1

| XPS Data | Oxygen Plasma Treatment Time (Tp) | Oxygen Composition "y" (when "x" = 1) |
|---|---|---|
| Curve 101 | 5 seconds | 0.66 |
| Curve 102 | 20 seconds | 0.77 |
| Curve 103 | 40 seconds | 0.84 |
| Curve 104 | 120 seconds | 0.95 |

As can be seen in Table 1, the more the oxygen plasma treatment time Tp was increased, the more the oxygen composition "y" was also increased.

Figure 7:
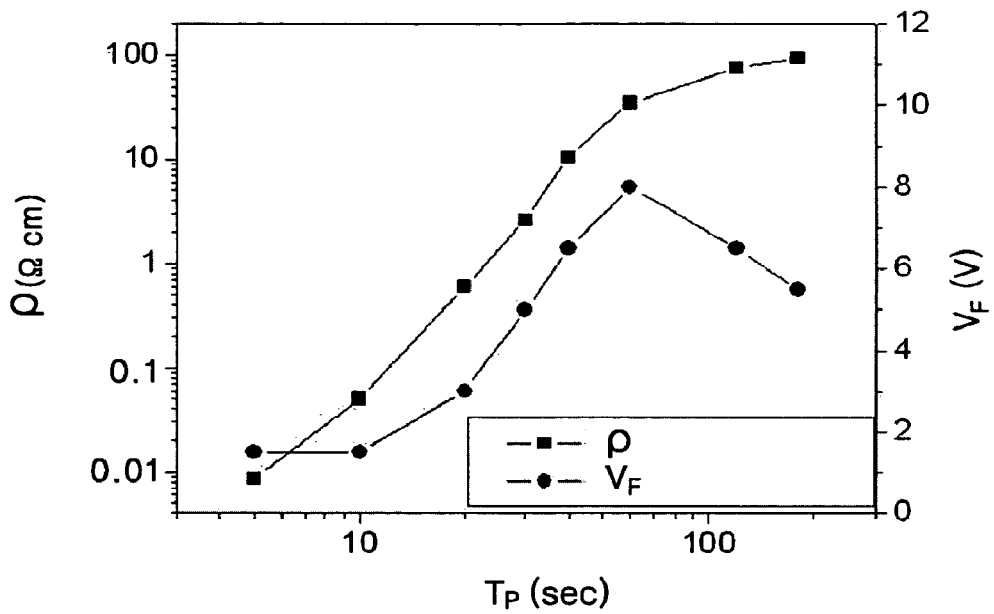
FIG. 7 is a graph illustrating resistivity and forming voltage of nickel oxide layers formed according to embodiments of the present invention.

FIG. 7 is a graph illustrating electrical characteristics of data storage elements employing nickel oxide ($Ni_xO_y$) layers manufactured according to embodiments of the present invention. In FIG. 7, the abscissa indicates the oxygen plasma treatment time Tp described with reference to FIG. 6, the left ordinate indicates resistivity ρ of the nickel oxide ($Ni_xO_y$) layers, and the right ordinate indicates a forming voltage $V_F$ of the data storage elements. The data storage elements were formed to have a rectangular shape having an area of 0.3×0.7 μm² when viewed from a plan view, and lower and upper electrodes of the data storage elements were formed of an iridium (Ir) layer having a thickness of 500 Å. The nickel oxide ($Ni_xO_y$) layer interposed between the lower and upper electrodes was formed to have a final thickness of 200 Å. In addition, the nickel oxide ($Ni_xO_y$) layer was formed by alternately and repeatedly performing a process for forming a nickel (Ni) layer using a sputtering technique and a process for oxidizing the nickel (Ni) layer using an oxygen plasma treatment technique, as described with reference to FIG. 6. That is, the nickel (Ni) layer was formed to a thickness of 10 Å, and the oxygen plasma treatment process was performed using an RF power of 20 watts and an oxygen gas injected with a flow rate of 2 sccm.

Referring to FIG. 7, the more the oxygen plasma treatment time Tp was increased, the more the resistivity ρ of the nickel oxide (NiO) layer was also increased. When the oxygen plasma treatment process was performed for about 3 to 200 seconds, the data storage elements exhibited a low forming voltage $V_F$ of about 1.5 V to 8 V.

In the meantime, when the oxygen plasma treatment process was performed for about 5 to 120 seconds, the nickel oxide ($Ni_xO_y$) layers exhibited the switching characteristics. As can be seen in Table 1 and FIG. 7, the nickel oxide ($Ni_xO_y$) layer exhibited the oxygen composition "y" of about 0.66 and the resistivity ρ of about 0.01 Ω·cm when the oxygen plasma treatment process was performed for 5 seconds, and the nickel oxide ($Ni_xO_y$) layer exhibited the oxygen composition "y" of about 0.95 and the resistivity ρ of about 100 Ω·cm when the oxygen plasma treatment process was performed for 120 seconds.

Figure 8:
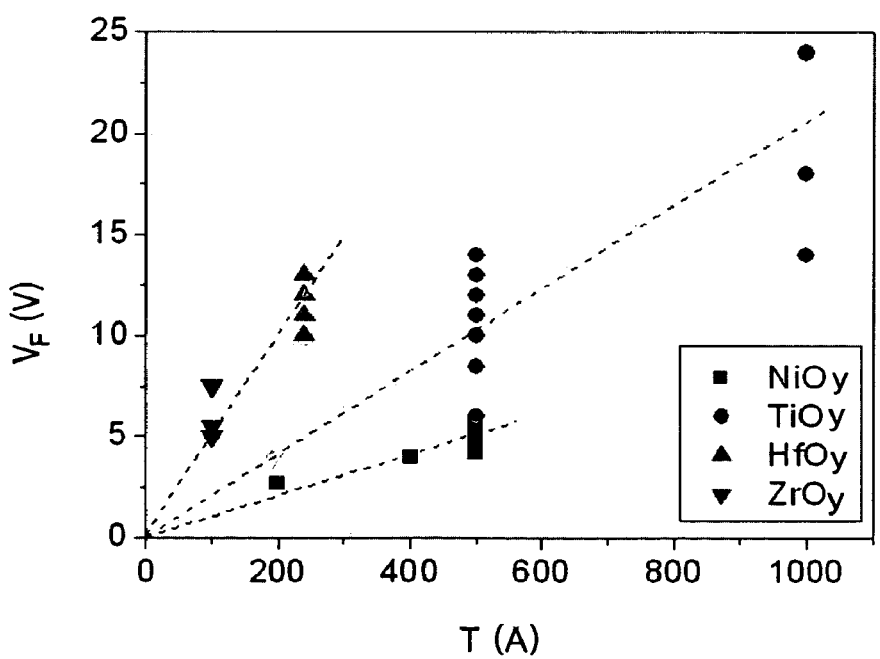
FIG. 8 is a graph illustrating a forming voltage vs. thickness characteristic of various transition metal oxide layers formed according to embodiments of the present invention.

FIG. 8 is a graph illustrating forming voltages of data storage elements that employ various transition metal oxide layers manufactured according to embodiments of the present invention. In FIG. 8, the abscissa indicates a thickness T of the transition metal oxide layers, and the ordinate indicates the forming voltage $V_F$ of the transition metal oxide layers. The lower and upper electrodes of the data storage elements were formed of an iridium (Ir) layer having a thickness of 500 Å. In addition, the data storage elements were formed to have a rectangular shape having an area of 0.3×0.7 µm² when viewed from a plan view.

In the graph of FIG. 8, when the transition metal oxide layers were formed of a nickel oxide ($Ni_xO_y$) layer, the nickel oxide ($Ni_xO_y$) layers were fabricated by applying the oxygen plasma treatment time Tp of 20 seconds. In other words, the nickel oxide ($Ni_xO_y$) layers were formed to have the oxygen composition "y" of 0.77 with the nickel composition "x" of 1. In the event that the transition metal oxide layers were formed of hafnium oxide ($Hf_xO_y$) layers or zirconium oxide ($Zr_xO_y$) layers, the hafnium oxide ($Hf_xO_y$) layers or the zirconium oxide ($Zr_xO_y$) layers were also formed using the sputtering technique and the oxygen plasma treatment technique. In other words, the hafnium oxide ($Hf_xO_y$) layers and the zirconium oxide ($Zr_xO_y$) layers were formed by alternately and repeatedly performing the sputtering process and the oxygen plasma treatment process.

In the meantime, when the transition metal oxide layers were formed of titanium oxide ($Ti_xO_y$) layers, an $O_2$ reactive sputtering technique was used to form the titanium oxide ($Ti_xO_y$) layers. In this case, the $O_2$ reactive sputtering process was performed at a temperature of 350° C. with a power of 10 kW. As can be seen in the graph of FIG. 8, the nickel oxide ($Ni_xO_y$) layers among the various transition metal oxide layers exhibited the lowest forming voltage. In particular, when the titanium oxide ($Ti_xO_y$) layers were formed to have a thickness of 200 Å, the titanium oxide ($Ti_xO_y$) layers exhibited a low forming voltage of about 2.5 V.

Figure 9:
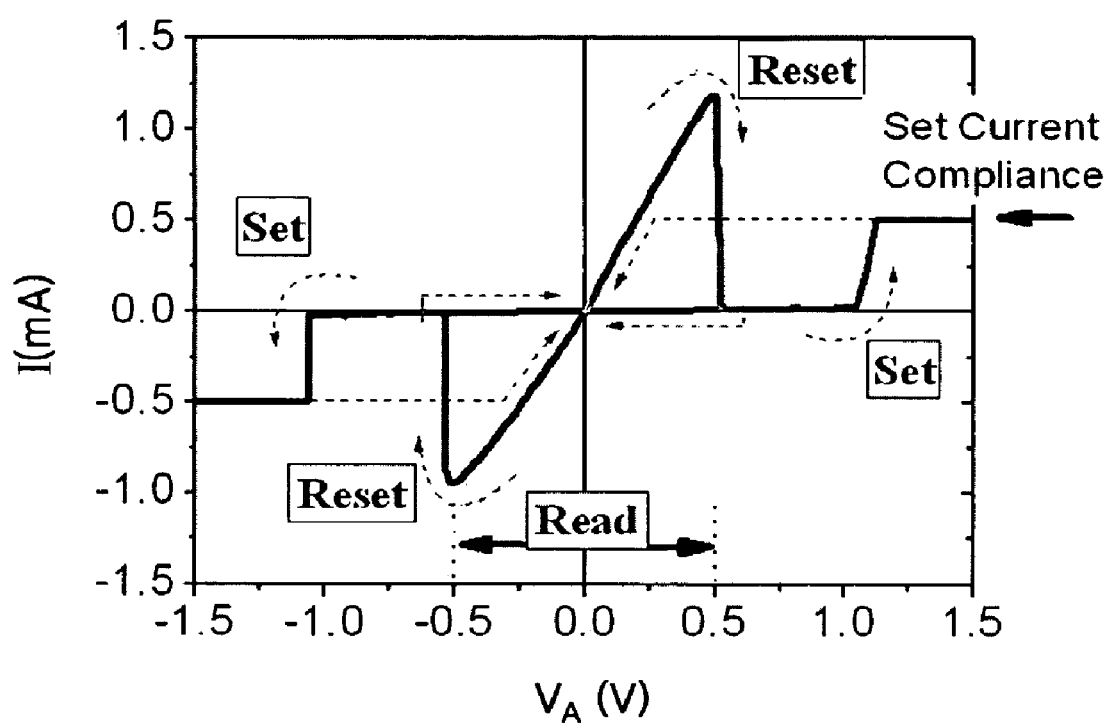
FIG. 9 is a graph illustrating a switching characteristic of a nickel oxide layer formed according to an embodiment of the present invention.

FIG. 9 is a graph illustrating a switching characteristic (I-V curve) of a data storage element that employs a nickel oxide layer manufactured according to an embodiment of the present invention. In FIG. 9, the abscissa indicates a voltage $V_A$ between the upper and lower electrodes of the data storage element, and the ordinate indicates a current I that flows through the nickel oxide ($Ni_xO_y$) layer. The lower and upper electrodes of the data storage element were formed of an iridium (Ir) layer having a thickness of 500 Å, and the nickel oxide ($Ni_xO_y$) layer was formed to have a final thickness of 200 Å. In addition, the nickel oxide ($Ni_xO_y$) layer was formed by alternately and repeatedly performing a first process for forming a nickel (Ni) layer using a sputtering technique and a second process for oxidizing the nickel (Ni) layer using an oxygen plasma treatment technique. The second process, that is, the oxygen plasma treatment process, was performed using an RF power of 20 watts and an oxygen gas injected with a flow rate of 2 sccm for 20 seconds. In addition, the data storage elements were formed to have a rectangular shape having an area of 0.3×0.7 µm² when viewed from a plan view.

Referring to FIG. 9, when the voltage $V_A$ between the upper and lower electrodes was about 0.5 V, the nickel oxide ($Ni_xO_y$) layer was switched to a reset state having a high resistance. On the other hand, when the voltage $V_A$ between the upper and lower electrodes was about 1.1 V, the nickel oxide ($Ni_xO_y$) layer was switched to a set state having a low resistance. A maximum allowable current (current compliance) was set to about 0.5 mA during application of the voltage $V_A$ in order to convert the nickel oxide ($Ni_xO_y$) layer to the set state. This limit is applied to prevent the nickel oxide ($Ni_xO_y$) layer from being damaged when a large amount of current flows through the nickel oxide ($Ni_xO_y$) layer having the set state. As shown in FIG. 9, the characteristic curve of the titanium oxide ($Ti_xO_y$) layer manufactured according to embodiments of the present invention was substantially symmetrical with respect to the cross point of the abscissa and the ordinate (point having coordinate of 0 V and 0 mA).

Figure 10:
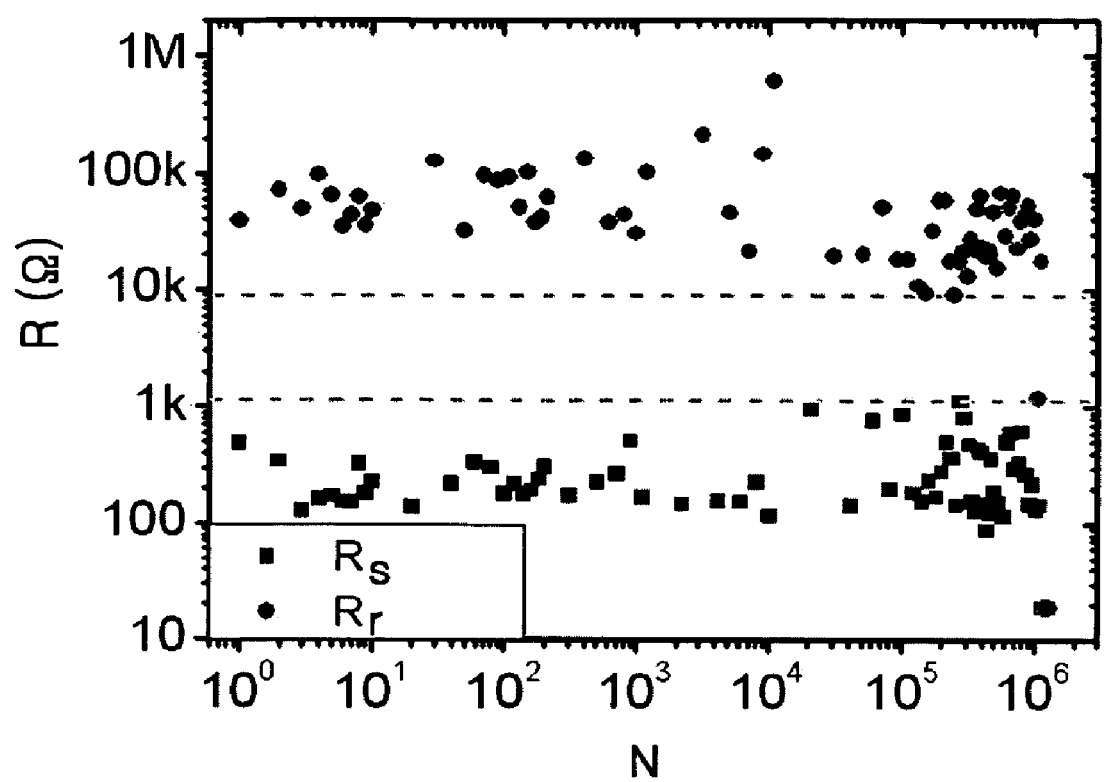
FIG. 10 is a graph illustrating switching endurance test results of resistance RAM cells employing nickel oxide layers manufactured according to embodiments of the present invention.

FIG. 10 is a graph illustrating switching endurance test results to data storage elements having nickel oxide layers manufactured according to embodiments of the present invention. The data storage elements were manufactured using the same method as described with reference to FIG. 9. In FIG. 10, the abscissa indicates the number N of switching operations, that is, the number of program cycles, and the ordinate indicates an electrical resistance R of the data storage elements. A reset voltage of 0.8 V was applied to the nickel oxide layers through the upper and lower electrodes for 1 millisecond in order to switch the data storage elements to the reset state. In addition, a set voltage of 1.5 V was applied to the nickel oxide layers through the upper and lower electrodes for 1 millisecond in order to switch the data storage elements to the set state. A maximum allowable current of about 0.5 mA was set while the set voltage was applied. As can be seen in FIG. 10, even though the data storage elements were subject to $1\times10^{16}$ repetitions of the reset and set operations, the data storage elements exhibited a set resistance Rs lower than about 1,000Ω and a reset resistance Rr higher than about 10,000Ω. According to the present invention as described above, it is possible to reduce operation voltages of a non-volatile memory cell employing a transition metal oxide layer by adjusting a composition ratio of the transition metal oxide layer. Therefore, it is possible to easily realize a high performance resistance RAM device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A non-volatile memory device, comprising:
a first switch element and a second switch element;
a first data storage element and a second data storage element disposed on a substrate and arranged next to each other, the first and second data storage elements respectively comprising:
a first electrode;
a second electrode disposed on the first electrode; and
a transition metal oxide layer disposed between the first and second electrodes;
wherein the transition metal oxide layer comprises $M_xO_y$, where M is a transition metal, O is oxygen, "x" and "y" are positive real numbers and x/y is greater than a same ratio associated with a stabilized transition metal oxide having the same transition metal; and
wherein the first switch element and the second switch element respectively control an access to the first and second data storage elements.

2. The non-volatile memory device of claim 1, wherein the first and second switch elements share a common source line.

3. The non-volatile memory device of claim 1, wherein the transition metal oxide layer comprises a transition metal having at least one of nickel, cobalt, zinc or copper.

4. The non-volatile memory device of claim 1, wherein the first and second electrodes comprise at least one of iridium (Ir), platinum (Pt), iridium oxide (IrO), titanium nitride (TiN), titanium aluminum nitride (TiAlN), ruthenium (Ru), ruthenium oxide (RuO) or polysilicon.

5. The non-volatile memory device of claim 1, further comprising a capping layer disposed on the first and second data storage elements.

6. The non-volatile memory device of claim 1, further comprising a buffer layer disposed on the first electrode, the buffer layer comprising at least one of Ti, TiN, TiAlN, Ta or TaN.

7. The non-volatile memory device of claim 1, wherein the first and second switch elements respectively comprise a transistor.

8. The non-volatile memory device of claim 1, further comprising a bit line disposed over and electrically contacting the second electrode.

9. The non-volatile memory device of claim 2, wherein the first and second data storage elements, the first and second switch elements, and the common source line are disposed at an active area defined by isolation layers.

10. The non-volatile memory device of claim 2, further comprising an interlayer insulating layer disposed on the substrate.

11. The non-volatile memory device of claim 10, further comprising a first drain contact pad and a second drain contact pad respectively disposed on the interlayer insulating layer, wherein the first and second drain contact pads and the common source line are formed simultaneously on the interlayer insulating layer.

12. The non-voltage memory device of claim 1, wherein the transition metal oxide layer stores non-volatile data.

13. A non-volatile memory device, comprising:
a substrate;
a first transistor and a second transistor disposed at an active area defined by isolation layers, the first and second transistors respectively comprising a gate electrode extending in a first direction, the first and second transistors sharing a common source region;
a first data storage element and a second storage element respectively comprising a first electrode, a second electrode, and a transition metal oxide layer;
respective first electrode electrically contacting a drain region of the respective first and second transistors; and
a bit line disposed over the first and second data storage elements and electrically connected to respective second electrode, the bit line extending in a second direction that is substantially perpendicular with respect to the first direction;
wherein the transition metal oxide layer comprises $M_xO_y$, where M is a transition metal, O is oxygen, "x" and "y" are positive real numbers and x/y is greater than a same ratio associated with a stabilized transition metal oxide having the same transition metal.

14. The non-volatile memory device of claim 13, wherein a common source line is disposed over and electrically connected to the common source region.

15. The non-volatile memory device of claim 13, wherein the transition oxide layer comprises a transition metal having at least one of nickel, cobalt, zinc or copper.

16. The non-volatile memory device of claim 13, further comprising an electrically conductive buffer layer pattern on the first electrode, wherein the buffer layer comprises at least one of Ti, TiN, TiAlN, Ta or TaN.

* * * * *